(12) United States Patent
Zhong

(10) Patent No.: US 12,176,332 B2
(45) Date of Patent: Dec. 24, 2024

(54) STRETCHABLE DISPLAY PANEL AND METHOD OF PRODUCING THE SAME

(71) Applicant: WUHAN CHINA STAR OPTOELECTRONICS SEMICONDUCTOR DISPLAY TECHNOLOGY CO., LTD., Hubei (CN)

(72) Inventor: Li Zhong, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 17/597,168

(22) PCT Filed: Dec. 17, 2021

(86) PCT No.: PCT/CN2021/139252
§ 371 (c)(1),
(2) Date: Dec. 28, 2021

(87) PCT Pub. No.: WO2023/103047
PCT Pub. Date: Jun. 15, 2023

(65) Prior Publication Data
US 2024/0030202 A1    Jan. 25, 2024

(30) Foreign Application Priority Data

Dec. 10, 2021    (CN) .......................... 202111508773.7

(51) Int. Cl.
*H01L 25/16* (2023.01)
*H01L 25/075* (2006.01)

(52) U.S. Cl.
CPC ........ *H01L 25/167* (2013.01); *H01L 25/0753* (2013.01)

(58) Field of Classification Search
None
See application file for complete search history.

(56) References Cited

U.S. PATENT DOCUMENTS 9,391,286 B1 *   7/2016   Kwon ................. H10K 50/858
2021/0027671 A1 *  1/2021   Lee ..................... H10K 59/131

FOREIGN PATENT DOCUMENTS

| CN | 109768052 A | 5/2019 |
| CN | 112310137 A | 2/2021 |
| CN | 112397559 A | 2/2021 |

(Continued)

OTHER PUBLICATIONS

International Search Report in International application No. PCT/CN2021/139252, mailed on Jul. 1, 2022.

(Continued)

*Primary Examiner* — Christopher J Kohlman

(57) ABSTRACT

A stretchable display panel and a method of producing the stretchable display panel are provided. The stretchable display panel has a driver integrated circuit occupying a small space in the present disclosure to reduce a required space for a circuit configured to drive a pixel unit to emit light, thereby benefiting the provision of spaces for arranging the pixel unit, so that the resolution of the stretchable display panel is increased.

16 Claims, 5 Drawing Sheets

(56) References Cited

FOREIGN PATENT DOCUMENTS

| | | |
|---|---|---|
| CN | 113096581 A | 7/2021 |
| CN | 113380849 A | 9/2021 |
| CN | 113451379 A | 9/2021 |
| CN | 113724590 A | 11/2021 |
| KR | 20170088013 A | 8/2017 |
| WO | 2019196338 A1 | 10/2019 |

OTHER PUBLICATIONS

Written Opinion of the International Search Authority in International application No. PCT/CN2021/139252, mailed on Jul. 1, 2022.
Chinese Office Action issued in corresponding Chinese Patent Application No. 202111508773.7 dated Jan. 28, 2023, pp. 1-9.

\* cited by examiner

STRETCHABLE DISPLAY PANEL AND METHOD OF PRODUCING THE SAME

FIELD OF INVENTION

The present disclosure relates to a display technical field, and specifically, to a stretchable display panel and a method of producing the stretchable display panel.

BACKGROUND OF INVENTION

As flat-panel display technology matures, many display companies have invested in the development of next-generation displays. Flexible display has the characteristics of being light and thin, impact-resistant, bendable, foldable, etc., opening up the popular application in display. As a foldable and rollable next-generation display technology, the stretchable display has the ability to be deformed and stretched in any direction. It can not only solve the display technical problems faced by the existing bending display, but also cover more abundant and diverse forms and application scenarios. Therefore, the research on stretchable displays has gradually become a research hotspot. At present, the traditional stretchable display device is a stretchable display device with flexible organic light-emitting diodes, and the stretchable display device with flexible organic light-emitting diodes is limited to the large size of the organic light-emitting diodes and the problem that the organic light-emitting diodes need to be packaged, causing the lower resolution of the stretchable display device.

Therefore, how to improve the resolution of a stretchable display device is a technical problem that needs to be solved.

SUMMARY OF DISCLOSURE

Technical Problem

An object of the present disclosure is to provide a stretchable display panel and a method of producing the stretchable display panel to benefit the resolution of the stretchable display panel.

Technical Solutions

A stretchable display panel, comprising
a plurality of pixel islands spaced at intervals, wherein each of the pixel islands includes:
a pixel unit; and
a driving circuit unit electrically connected to the pixel unit, wherein the driving circuit unit is disposed on one side of the pixel unit, and the driving circuit unit is configured to drive the pixel unit to emit light, wherein the driving circuit unit includes:
a driver integrated circuit electrically connected to the pixel unit and comprising a plurality of driving device; and
a drive wiring unit disposed on one side of the driver integrated circuit away from the pixel unit and electrically connected to the driver integrated circuit, wherein the drive wiring unit includes a plurality of drive wirings; and
a plurality of connecting lines connecting the driving wiring units of adjacent two of the pixel islands.
A method of producing a stretchable display panel, comprising steps of:
connecting a pixel unit to a driver integrated circuit; and
connecting a drive wiring unit to the driver integrated circuit to obtain the stretchable display panel;
wherein, the driver integrated circuit includes a plurality of driving devices; the drive wiring unit includes a plurality of drive wirings; connecting lines are disposed between adjacent two drive wiring units; the pixel unit and the drive wiring unit are located at two opposite sides of the driver integrated circuit, respectively; and the driver integrated circuit, the pixel unit connecting the driver integrated circuit, and the drive wiring unit constitute a pixel island.

Beneficial Effect:

The present disclosure provides a stretchable display panel and a method of producing the same. Driving devices for driving a pixel unit to emit light are integrated in a driver integrated circuit to reduce a space deployed for the driving devices to drive the pixel units to emit light, and therefore there is more space for arranging a plurality of pixel units and connecting lines. More pixel units help to improve the resolution of the stretchable display panel, and arrangement of the connecting lines in a larger space helps to improve the stretchability of the stretchable display panel. Additionally, the design of the driver integrated circuit allows the driver integrated circuit to bind with the pixel units and the drive wiring units, respectively, in order to obtain the stretchable display panel, and the manufacturing process of the stretchable display panel is simplified.

DETAILED DESCRIPTION OF PREFERRED EMBODIMENTS

The technical solutions in embodiments of the present disclosure will be described clearly and completely in conjunction with the drawings in the embodiments of the present disclosure. Apparently, the described embodiments are only a part of the embodiments of the present disclosure, but not all of the embodiments. Based on the embodiments in the present disclosure, other embodiments obtained by those skilled in the art without creative work would fall within the protection scope of the present disclosure.

Figure 1:
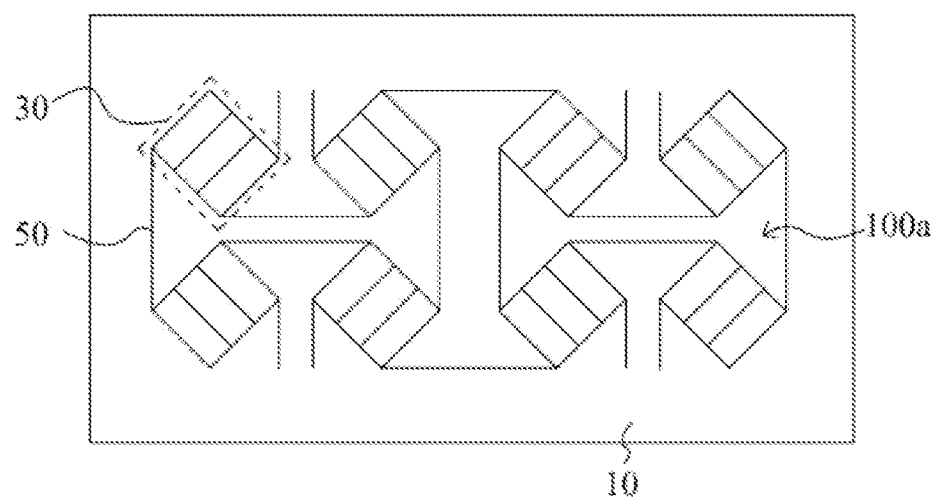
FIG. 1 is a schematic plan view of a stretchable display panel in one embodiment of the present disclosure.
Figure 2:
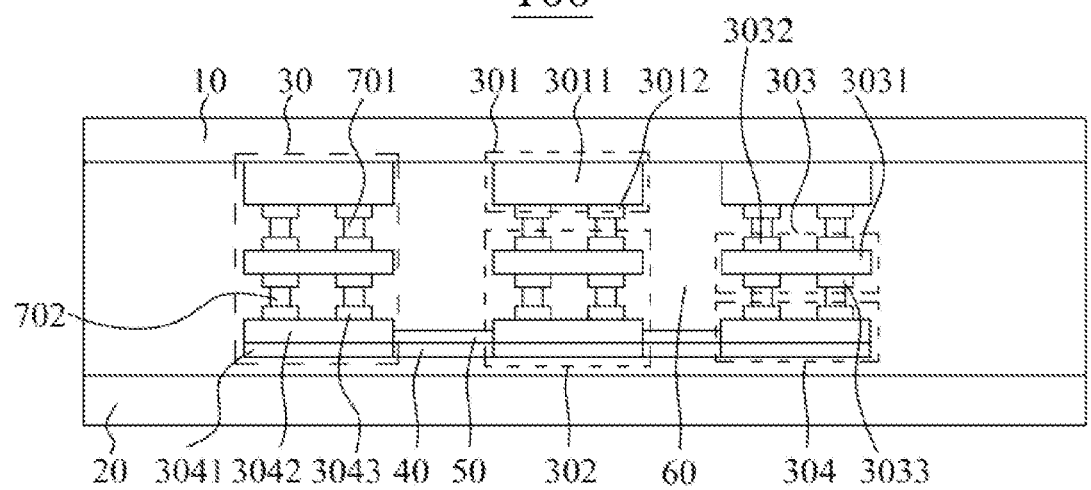
FIG. 2 is a cross-sectional view of a stretchable display panel according to one embodiment of the present disclosure.

As shown in FIG. 1 and FIG. 2, the present disclosure provides a stretchable display panel 100 which can show images while it is stretched under an external force. When the applied external force is removed, the stretchable display panel restores to an original state. The stretchable display panel 100 in the present embodiment includes a first substrate 10, a second substrate 20, a plurality of pixel islands 30, a connecting substrate 40, a plurality of connecting lines 50 and a filling glue 60.

In this embodiment, the first substrate 10 and the second substrate 20 are disposed opposite to each other. The first substrate 10 and the second substrate 20 are both organic film layers. On the one hand the first substrate 10 and the second substrate 20 provides a support for the pixel islands 30. On the other hand, the first substrate 10 and the second substrate in a process of stretching the stretchable display panel 100 have a flexibility to ensure the tensile performance of the stretchable display panel 100. It is characterized that the first substrate 10 is located at a light-emitting side of the stretchable display panel 100, and the second substrate 20 is located at a back side of the light-emitting side of the stretchable display panel 100. The first substrate 10 is a transparent organic film layer to ensure the light-emitting efficiency of the stretchable display panel 100. The second substrate 20 may be a transparent or opaque organic film layer.

Specifically, the first substrate 10 and the second substrate 20 are a silicone made of polydimethylsiloxane or an elastomer made of polyurethane.

In this embodiment, a surface of the first substrate 10 close to the second substrate 20 has an adhesiveness to facilitate the pixel islands 30 to be directly adhered on the first substrate 10. The first substrate 10 provides a support for a plurality of pixel islands 30. A surface of the second substrate 20 close to the first substrate 10 may also have an adhesiveness to facilitate the pixel islands 30 to be directly adhered on the second substrate 20.

It should be noted that a thinner adhesive layer may be coated on the surface of the first substrate 10 and the surface of the second substrate 20 to make the surface of the first substrate 10 and the surface of the second substrate 20 have adhesiveness.

In this embodiment, a plurality of pixel islands 30 are configured to emit visible light to achieve display. The pixel islands 30 are in array arrangement and the pixel islands 30 are spaced at intervals and disposed between the first substrate 10 and the second substrate 20. Each of the pixel islands 30 includes one pixel unit 301 and one driving circuit unit 302. One driving circuit unit 302 electrically connects one pixel unit 301. The driving circuit unit 302 is configured to drive the pixel unit 301 for emitting light. The first substrate 10 is disposed close to the pixel unit 301. The second substrate 20 is disposed close to the driving circuit unit 302. It is characterized that the pixel unit 301 is bonded on the driving circuit unit 302 by mass transfer and bonding process.

In this embodiment, the pixel unit 301 includes a light-emitting chip 3011 and a plurality of first conductive pads 3012. The first conductive pads 3012 electrically connect the light-emitting chip 3011. The first conductive pads 3012 are located at one side of the pixel unit 301 close to the driving circuit unit 302. The first conductive pads 3012 include N pins and P pins. The light-emitting chip 3011 may include a red light-emitting chip, a green light-emitting chip, and a blue light-emitting chip. It is understood that the light-emitting chip 3011 may include a monochromatic light chip and a color conversion layer. The color conversion layer converts the monochromatic light emitted by the monochromatic light chip into polychromatic light. The color conversion layer includes phosphors, quantum dots, etc.

In this embodiment, the pixel unit 301 includes inorganic light emitting diodes. The inorganic light emitting diodes may be vertical type inorganic light emitting diodes or flip chip inorganic light emitting diodes. The inorganic light emitting diodes may be micro light emitting diodes, sub-millimeter light-emitting diodes, etc. Specifically, the pixel unit 301 is made of micro light-emitting diodes. Compared with the pixel unit 301 composed of organic light-emitting diodes, the pixel unit 301 is composed of inorganic light emitting diodes so that the pixel unit 301 has a smaller size to benefit the reduction of the size of the pixel units 301, and therefore more pixel units 301 can be deployed in the same layout space, which is beneficial to improve the resolution of the stretchable display panel 100. Additionally, smaller pixel unit 301 provides more layout space for the connecting lines 50, which is also beneficial to improve the stretchability of the stretchable display panel 100.

In this embodiment, the pixel unit 301 of the pixel islands 30 adheres on a surface of the first substrate 10 close to the pixel unit 301 so that the pixel unit 301 does not move significantly during stretching the stretchable display panel 100. The pixel unit 301 has no significant movement relative to the part bonded to the first substrate 10. It is characterized that a light emitting surface of the pixel unit 301 adheres to the first substrate 10. This embodiment by adhering the pixel unit 301 of the pixel islands 30 to the first substrate 10 to fix the pixel islands 30 on the first substrate 10.

In this embodiment, the driving circuit unit 302 is disposed on one side of the pixel unit 301. Each driving circuit unit 302 includes a driver integrated circuit 303 and a drive wiring unit 304. The drive wiring unit 304 is disposed on one side of the driver integrated circuit 303 away from the pixel unit 301. The driver integrated circuit 303 electrically connects the pixel unit 301. The drive wiring unit 304 electrically connects the driver integrated circuit 303. It is characterized that the drive wiring unit 304 provides a signal for display to the driver integrated circuit 303, and the driver integrated circuit 303 generates a driving current based on the signal for display so that the pixel unit 301 emits light under the driving current.

In this embodiment, the driver integrated circuit 303 is prepared by integrated circuit process and has an advantage of small size. The driver integrated circuit 303 includes an drive integrated chip 3031, a plurality of second conductive pads 3032 and a plurality of third conductive pads 3033. The drive integrated chip 3031 includes a plurality of driving devices (not shown). The second conductive pads 3032 are disposed on one side of the driver integrated circuit 303 close to the pixel unit 301. The third conductive pads 3033 are disposed on one side of the driver integrated circuit 303 close to the drive wiring unit 304. The first conductive pads 3012 of the pixel unit 301 are bonded on the second conductive pads 3032 of the driver integrated circuit 303, the third conductive pads 3033 of the driver integrated circuit 303 electrically connect the drive wiring unit 304.

It is characterized that each of the driving devices includes at least one of a switching unit and a storage unit. The switching unit may include at least one of field effect transistors and thin film transistors. The storage unit may be a capacitor. For example, the driver integrated circuit 303 may include seven thin film transistors and one capacitor. The driver integrated circuit 303 may also include six thin film transistors and two capacitors. Alternatively, the driver integrated circuit 303 includes five thin film transistors and one capacitor. The driver integrated circuit 303 further includes NMOS, PMOS, or CMOS. It can be understood that the driver integrated circuit 303 may further include necessary wiring design.

In this embodiment, the drive wiring unit 304 is obtained by manufacturing process of a conventional display panel. The manufacturing process of the conventional display panel includes yellow light manufacturing process. The second substrate 20 is disposed close to the drive wiring unit 304. The drive wiring unit 304 includes an island-shaped substrate 3041 and a drive wiring layer 3042. The drive wiring layer 3042 is disposed on the island-shaped substrate 3041. The drive wiring layer 3042 includes a plurality of drive wirings 3044, and the drive wiring layer 3042 is located between the island-shaped substrate 3041 and the driver integrated circuit 303 in a direction along a thickness of the stretchable display panel 100.

Figure 3:
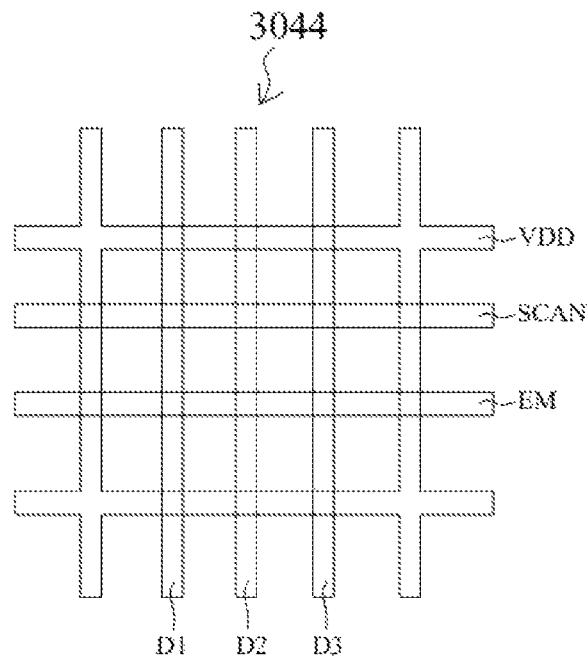
FIG. 3 is a schematic plan view of a plurality of drive wirings of a drive wiring unit in the stretchable display panel shown in FIG. 2.

It is characterized that each drive wiring layer 3042 is correspondingly disposed on one island-shaped substrate 3041. The drive wiring layer 3042 includes a metal layer and an insulating layer. The number of the metal layer may be one, two, or more. The metal layer includes a plurality of drive wirings 3044 and a plurality of fourth conductive pads 3043. The drive wirings 3044 and the fourth conductive pads 3043 are connected. The drive wirings 3044 are configured to transmit electrical signals. The drive wirings 3044 include one or more of data lines, scan lines, power signal lines, and reset lines. For example, as shown in FIG. 3, the drive wirings 3044 include a plurality of data lines, scan lines (SCAN), and power signal lines (VDD). The data lines, scan lines (SCAN) and power signal lines (VDD) are insulated against each other. The data lines extend along a column direction. The data lines include data lines D1, data lines D2, and data lines D3. The scan lines (SCAN) extend along a row direction. The data lines and the scan lines (SCAN) intersect perpendicularly. The power signal lines (VDD) are grid-like. The fourth conductive pads 3043 of the drive wiring layer 3042 are bonded on the third conductive pads 3033 of the driver integrated circuit 303 so as to electrically connect the driver integrated circuit 303 and the drive wiring units 304. The insulating layer includes an inorganic insulating layer and an organic insulating layer. The number of the insulating layer may be one, two, or more. The insulating layer includes one or more of silicon nitride layer, silica layer, and aluminum oxide layer.

A plurality of island-shaped substrates 3041 are bulk substrates. The shape of the island-shaped substrate 3041 may be rectangle, circle, or other shape. The modulus of the island-shaped substrate 3041 is greater than the modulus of the first substrate 10 and the second substrate 20, so that the stretchability of the island-shaped substrate 3041 is smaller than that of the first substrate 10 and the second substrate 20. Specifically, the preparation material of the island-shaped substrate 3041 is polyimide.

In this embodiment, there is a first connector 701 disposed between the first conductive pads 3012 of the pixel unit 301 and the second conductive pads 3032 of the driver integrated circuit 303. There is a second connector 702 disposed between the fourth conductive pads 3043 of the drive wiring units 304 and the third conductive pads 3033 of the driver integrated circuit 303. The first connector 701 and the second connector 702 are both welded metal parts. The material of preparing the welded metal parts may be low temperature welding metals such as In, Sn, and InSn alloy. It is characterized that the connection of the pixel unit 301 and the driver integrated circuit 303 is achieved by using a mass transfer and bonding process. The connection of the driver integrated circuit 303 and the drive wiring unit 304 is achieved by using a mass transfer and bonding process.

In this embodiment, a plurality of connecting lines 50 connect the drive wiring units 304 of adjacent two pixel islands 30 so as to connect the drive wirings on adjacent two pixel islands 30, so that electrical signals transmitted by the drive wirings transmit between the adjacent two pixel islands 30. The connecting lines 50 located at the same layer are spaced at intervals. An organic insulating layer is disposed between the connecting lines 50 located at different layers to ensure the stretchability of the connecting lines 50 during the stretching process. The connecting lines 50 can be linear. The connecting lines can also be curvilinear. The material of preparing the connecting lines 50 is a metal.

It should be noted that the multiple connecting lines 50 are electrically connected to the drive wiring in the drive wiring layer 3042 through bridging. The preparation process of the connecting lines 50 is basically similar to the preparation process of the drive wirings of the drive wiring layer 3042. The difference is that the inorganic film layer corresponding to the connecting lines 50 needs to be removed, while the inorganic film layer in the drive wiring layer 3042 remains.

In this embodiment, the connecting substrate 40 is disposed on the same layer as the island-shaped substrates 3041. The connecting substrate 40 and the island-shaped substrates 3041 are prepared by patterning the same organic film layer. The connecting lines 50 are disposed on the connecting substrate 40 to support the connecting lines 50.

In this embodiment, stretchable display panel 100 includes a patterned substrate. The patterned substrate includes a connecting substrate 40, an island-shaped substrate 3041, and a hollow portion 100a. The hollow portion 100a passes through the patterned substrate in a direction of a thickness of the patterned substrate, and the hollow portion 100a is located within an area surrounded by a plurality of the island-shaped substrates 3041 and a plurality of the connecting substrates 40 which connect the adjacent island-shaped substrates 3041. For example, as shown in FIG. 1, the hollow portion 100a is located within an area surrounded by four adjacent island-shaped substrates 3041 and the connecting substrates 40 connecting the four adjacent island-shaped substrates 3041.

In this embodiment, at least a part of the filling glue 60 is filled between two adjacent pixel islands 30. A filling glue 60 is an adhesive. The filling glue 60 may be transparent or opaque. Specifically, the filling glue 60 is filled in an area between two pixel units 301 of adjacent two of the pixel islands 30, an area between two driver integrated circuits 303 of adjacent two of the pixel islands 30, and an area between two drive wiring units 304 of adjacent two of the pixel islands 30. It is characterized that the area between the two drive wiring units 304 of the adjacent two of the pixel islands 30 includes the hollow portion 100a, i.e., the filling glue 60 is also filled within the hollow portion 100a.

The filling glue 60 in this embodiment has an adhesiveness and a flexibility. The flexibility of the filling glue 60 makes the stretchable display panel 100 have a better stretchability during stretching. The flexibility and the adhesiveness of the filling glue 60 cooperate with each other to ensure the pixel islands 30 to restore the original state after removing the external force applied to the stretchable display panel 100 so that the stability of the stretchable display panel 100 is enhanced.

In this embodiment, the filling glue 60 is further disposed between the drive wiring unit 304 and the second substrate 20 so that the drive wiring unit 304 is indirectly attached on the second substrate 20. The drive wiring unit 304 may move relative to the second substrate 20 during the stretching the stretchable display panel 100, and further the stretchability of the stretchable display panel 100 is enhanced. It should be noted that a surface of the second substrate 20 close to the first substrate 10 has an adhesiveness, and the drive wiring unit 304 is directly adhered on the surface of the second substrate 20.

It should be noted that the drive wiring unit 304 of the stretchable display panel of this embodiment may also be directly bonded to the second substrate 20, the driver integrated circuit 303 is bonded to the drive wiring unit 304, the pixel unit 301 is bonded to the drive wiring unit 304, and the filling glue 60 is filled between the pixel unit 301 and the first substrate 10.

The driver integrated circuit in this embodiment is prepared by using an integrated circuit process. Compared with the thin film transistor prepared by the conventional display panel process, which occupies greater space, the driver integrated circuit has an advantage of small sizes. When it is applied to the stretchable display panel, it occupies a smaller space to allow more space for pixel units to be deployed together with the pixel units made of inorganic light emitting diodes so as to further enhance the resolution of the stretchable display panel. Additionally, the design of the driver integrated circuit with inorganic light emitting diodes allows the more space for arranging the connecting lines so that the stretchability of the connecting lines is enhanced to further improve the stretchability of the stretchable display panel. Furthermore, binding the driver integrated circuit to the drive wiring layer simplifies the preparing process of the stretchable display panel. The design of the driver integrated circuit also reduces the risk of damage to the circuit of the driver integrated circuit.

Figure 4:
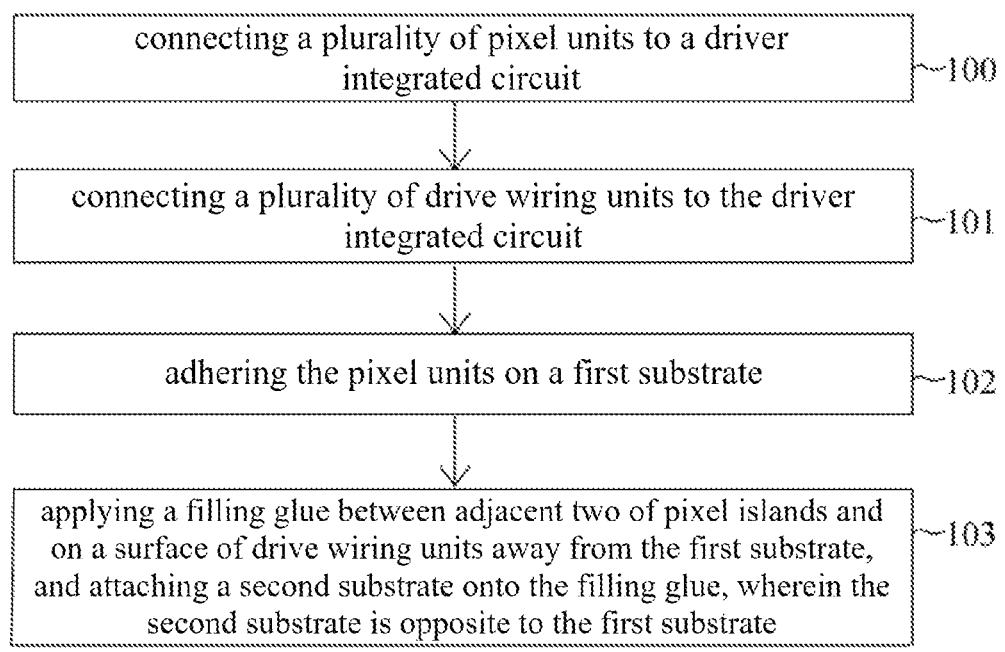
FIG. 4 is a flow chart showing a method of producing a stretchable display panel according to one embodiment of the present disclosure.

As shown in FIG. 4, the present disclosure also provides a method of producing a stretchable display panel. The method of producing the stretchable display panel comprises steps of:

Step 100: connecting a pixel unit to a driver integrated circuit.

Specifically, a plurality of driver integrated circuits 303 and a plurality of pixel units 301 are provided. The number of the driver integrated circuits 303 is the same as the number of the pixel units 301. It is characterized that the driver integrated circuit 303 includes a drive integrated chip, two second conductive pads 3032 and a plurality of third conductive pads 3033. The drive integrated chip includes a driving device, a plurality of second conductive pads 3032, and two third conductive pads 3033 disposed on two opposite sides of the driver integrated circuit 303. The pixel unit 301 includes a light-emitting chip 3011 and two first conductive pads 3012. Each light-emitting chip 3011 includes red light micro light emitting diodes, green light micro light emitting diodes, and blue light micro light emitting diodes.

Figure 5A:
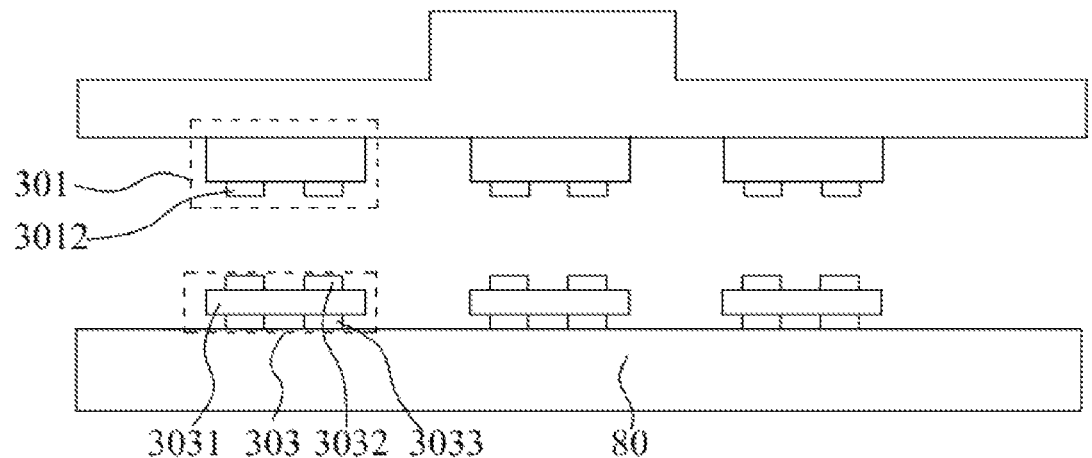
FIGS. 5A-5E are schematic views of a process of producing a stretchable display panel according to one embodiment of the present disclosure.
Figure 5B:
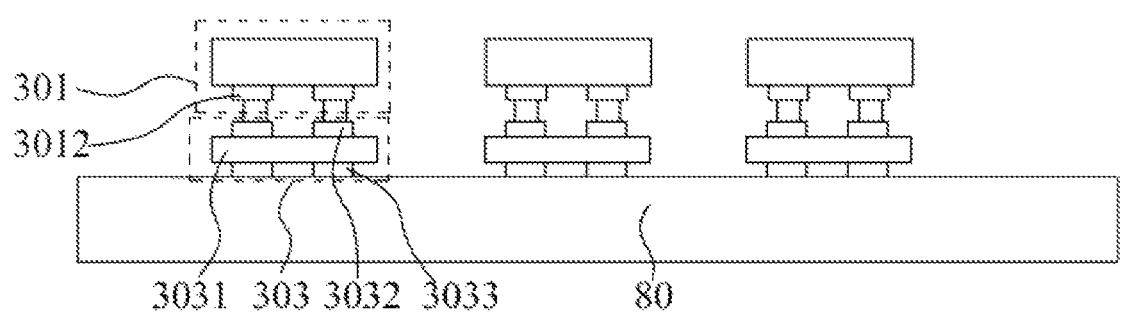

By a mass transfer process, the driver integrated circuits 303 are transferred to a first carrier substrate 80, and the two second conductive pads 3032 of the driver integrated circuit 303 are located at one side of the driver integrated circuit 303 away from the first carrier substrate 80, and then connecting the two first conductive pads 3012 of the pixel units 301 with the two second conductive pads 3032 of the driver integrated circuit 303 by a mass transfer and welding process. The pixel unit 301 and the driver integrated circuit 303 are in a form of one-to-one connection as shown in FIG. 5A and FIG. 5B.

Step 101: connecting a plurality of drive wiring unit to the driver integrated circuit.

Specifically, forming a plurality of drive wiring units 304 and a plurality of connecting lines 50 on a glass substrate 90. The connecting lines connect adjacent two drive wiring units 304. The drive wiring unit 304 includes an island-shaped substrate 3041 and a drive wiring layer 3042. The drive wiring layer 3042 includes a plurality of drive wirings and a plurality of fourth conductive pads. The island-shaped substrate 3041 is disposed on the glass substrate 90. The drive wiring layer 3042 is disposed on the island-shaped substrate 3041.

Figure 5C:
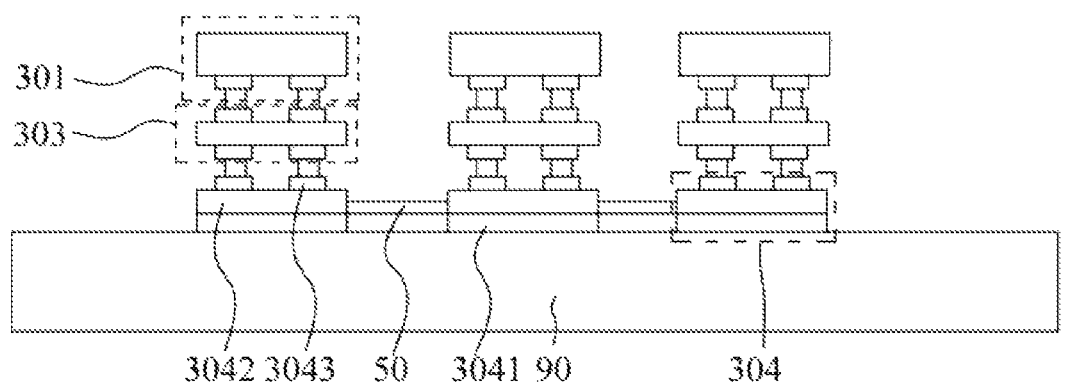

Transferring the entire connection between the pixel units 301 and the driver integrated circuit 303 in step 100 through the transfer head, and using a welding process to connect the third conductive pads 3033 of the driver integrated circuit 303 and the fourth conductive pads 3043 of the drive wiring layer 3042, as shown in FIG. 5C.

It should be noted that the pixel islands 30 is composed of the driver integrated circuit 303, the pixel unit 301 connected with the driver integrated circuit 303, and the drive wiring unit 304. The connecting lines 50 are disposed between adjacent two of the pixel islands 30.

Step 102: adhering the pixel units on a first substrate.

Figure 5D:
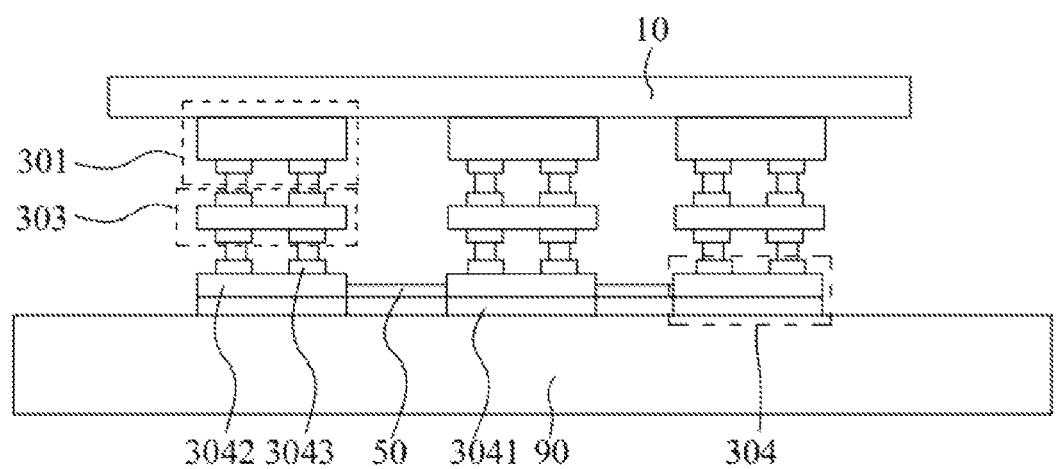

Specifically, adhering a surface of the first substrate 10 having an adhesiveness to a plurality of pixel units 301 to adhere the pixel units 301 to the first substrate 10, as shown in FIG. 5D.

Step 103: applying a filling glue between adjacent two of the pixel islands and on a surface of the drive wiring unit away from the first substrate, and adhering a second substrate to the filling glue, wherein the second substrate and the first substrate are disposed opposite to each other.

Figure 5E:
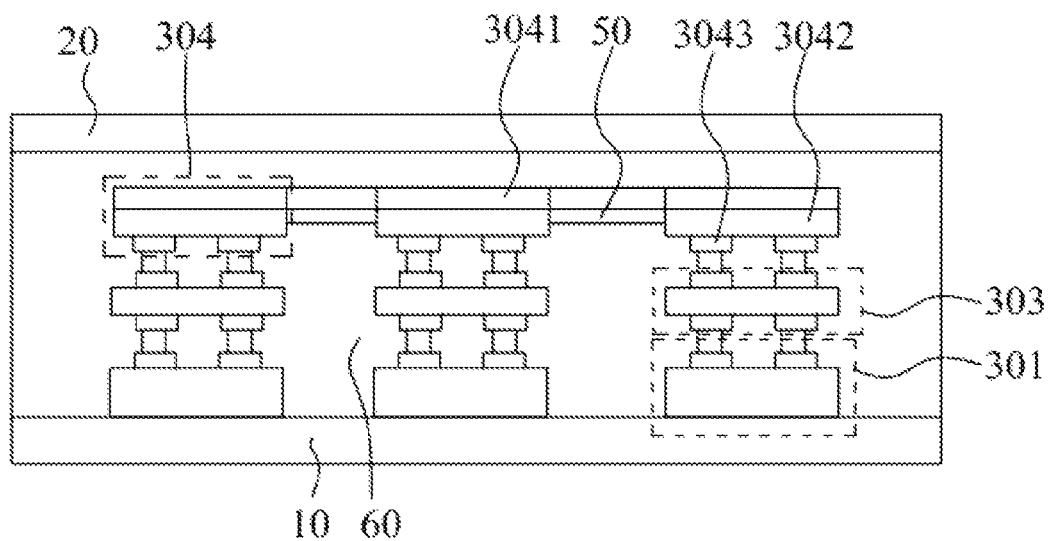

Specifically, using the first substrate 10 with the pixel unit 301, the driver integrated circuit 303, the drive wiring unit 304 and the connecting lines thereon as a carrier board. A filling glue 60 is disposed between adjacent two of the pixel islands 30 and on a surface of the drive wiring unit 304 away from the first substrate 10, and the second substrate 20 is adhered to the filling glue 60 to obtain the stretchable display panel 100 as shown in FIG. 5E.

In this embodiment, the method of producing the stretchable display panel is to prepare the drive wiring units and connect the connection of the drive wiring units through the traditional display panel manufacturing process, and bind the integrated drive circuit prepared by the integrated process to the pixel units and the drive wiring units, respectively. The manufacturing process of the stretchable display panel is thus simplified.

The description of the abovementioned embodiments is merely for helping the technical solutions and the core concept of the present disclosure being understood. It can be understood that, for those of ordinary skill in the art, modifications or equivalent replacements of the technical solutions in the abovementioned embodiments can be made, and all of these modifications or replacements shall not render the nature of the technical solutions depart from the respective technical solutions in the present disclosure.

What is claimed is:
1. A stretchable display panel, comprising:
 a plurality of pixel islands spaced at intervals, wherein each of the pixel islands comprises:
   a pixel unit; and
   a driving circuit unit electrically connected to the pixel unit, wherein the driving circuit unit is disposed on one side of the pixel unit, and the driving circuit unit is configured to drive the pixel unit to emit light, wherein the driving circuit unit comprises:
     a driver integrated circuit electrically connected to the pixel unit and comprising a plurality of driving device devices; and
     a drive wiring unit disposed on one side of the driver integrated circuit away from the pixel unit and electrically connected to the driver integrated circuit, wherein the drive wiring unit comprises a plurality of drive wirings; and
   a plurality of connecting lines connecting the driving wiring units of adjacent two of the pixel islands;

wherein the stretchable display panel further comprises:
a first substrate;
a second substrate disposed opposite to the first substrate; and
a filling glue, wherein at least a part of the filling glue is filled between adjacent two of the pixel islands;
wherein the pixel islands are disposed between the first substrate and the second substrate, and the first substrate is disposed close to the pixel unit, and the second substrate is disposed close to the drive wiring unit.

2. The stretchable display panel according to claim 1, wherein a surface of the first substrate close to the pixel unit has adhesiveness, and the pixel unit of the pixel islands bonds to a surface of the first substrate close to the pixel unit.

3. The stretchable display panel according to claim 1, wherein the filling glue is further disposed between the drive wiring unit and the second substrate.

4. The stretchable display panel according to claim 1, wherein the first substrate and the second substrate both are organic film layers.

5. The stretchable display panel according to claim 1, wherein the drive wiring unit comprises:
an island-shaped substrate; and
a drive wiring layer comprising the drive wirings and disposed on the island-shaped substrate, wherein the drive wiring layer is located between the island-shaped substrate and the driver integrated circuit.

6. The stretchable display panel according to claim 5, wherein the stretchable display panel further comprises:
a connecting substrate, wherein the connecting substrate and the island-shaped substrates are disposed on the same layer, and the connecting substrate connects two adjacent island-shaped substrates, and the connecting lines are disposed on the connecting substrate.

7. The stretchable display panel according to claim 6, wherein the stretchable display panel includes a patterned substrate comprising:
the island-shaped substrates;
the connecting substrate; and
a hollow portion passing through the patterned substrate in a direction along a thickness of the patterned substrate, wherein the hollow portion is located within an area surrounded by a plurality of the island-shaped substrates and a plurality of the connecting substrates which connect the adjacent island-shaped substrates, and the filling layer is filled within the hollow portion.

8. The stretchable display panel according to claim 1, wherein one side of the pixel unit close to the driver integrated circuit includes a plurality of first conductive pads, the driver integrated circuit comprises a plurality of second conductive pads and a plurality of third conductive pads, the second conductive pads are disposed on one side of the driver integrated circuit close to the pixel unit, the third conductive pads are disposed on one side of the driver integrated circuit close to the drive wiring unit, and the drive wiring unit comprises a plurality of fourth conductive pads close to the driver integrated circuit; wherein the first conductive pads of the pixel unit are bonded on the second conductive pads of the driver integrated circuit, the fourth conductive pads of the drive wiring unit are bonded on the third conductive pads of the driver integrated circuit.

9. The stretchable display panel according to claim 8, wherein the stretchable display panel further comprises:

a first connector disposed between the first conductive pads of the pixel unit and the second conductive pad of the driver integrated circuit; and
a second connector disposed between the fourth conductive pads of the drive wiring unit and the third conductive pads of the driver integrated circuit.

10. The stretchable display panel according to claim 1, wherein the pixel unit comprises inorganic light emitting diodes.

11. A method of producing a stretchable display panel, comprising steps of:
connecting a pixel unit to a driver integrated circuit; and
connecting a drive wiring unit to the driver integrated circuit to obtain the stretchable display panel;
wherein, the driver integrated circuit includes a plurality of driving devices; the drive wiring unit comprises a plurality of drive wirings; connecting lines are disposed between adjacent two drive wiring units; the pixel unit and the drive wiring unit are located at two opposite sides of the driver integrated circuit, respectively; and the driver integrated circuit, the pixel unit connecting the driver integrated circuit, and the drive wiring unit constitute a pixel island;
wherein the method further comprises a step of:
adhering the pixel unit on the first substrate; and
filling a filling glue between adjacent two pixel islands.

12. The method of producing a stretchable display panel according to claim 11, further comprising steps of:
applying the filling glue on a surface of the drive wiring unit away from the first substrate; and
adhering the second substrate onto the filling glue, wherein the second substrate and the first substrate are opposite to each other.

13. The method of producing a stretchable display panel according to claim 12, wherein the first substrate and the second substrate are both organic film layers.

14. The method of producing a stretchable display panel according to claim 11, wherein the pixel unit comprises inorganic light emitting diodes.

15. A stretchable display panel, comprising:
a plurality of pixel islands spaced at intervals, wherein each of the pixel islands comprises:
a pixel unit; and
a driving circuit unit electrically connected to the pixel unit, wherein the driving circuit unit is disposed on one side of the pixel unit, and the driving circuit unit is configured to drive the pixel unit to emit light, wherein the driving circuit unit comprises:
a driver integrated circuit electrically connected to the pixel unit and comprising a plurality of driving devices; and
a drive wiring unit disposed on one side of the driver integrated circuit away from the pixel unit and electrically connected to the driver integrated circuit, wherein the drive wiring unit comprises a plurality of drive wirings; and
a plurality of connecting lines connecting the driving wiring units of adjacent two of the pixel islands;
wherein one side of the pixel unit close to the driver integrated circuit includes a plurality of first conductive pads, the driver integrated circuit comprises a plurality of second conductive pads and a plurality of third conductive pads, the second conductive pads are disposed on one side of the driver integrated circuit close to the pixel unit, the third conductive pads are disposed on one side of the driver integrated circuit close to the drive wiring unit, and the drive wiring unit comprises a plurality of fourth conductive pads close to the driver integrated circuit;

wherein the first conductive pads of the pixel unit are bonded on the second conductive pads of the driver integrated circuit, the fourth conductive pads of the drive wiring unit are bonded on the third conductive pads of the driver integrated circuit.

16. The stretchable display panel according to claim 15, wherein the stretchable display panel further comprises:
   a first connector disposed between the first conductive pads of the pixel unit and the second conductive pad of the driver integrated circuit; and
   a second connector disposed between the fourth conductive pads of the drive wiring unit and the third conductive pads of the driver integrated circuit.

* * * * *